(12) United States Patent
Chen et al.

(10) Patent No.: US 10,265,828 B2
(45) Date of Patent: Apr. 23, 2019

(54) METHOD AND SYSTEM FOR MONITORING POLISHING PAD BEFORE CMP PROCESS

(71) Applicant: Taiwan Semiconductor Manufacturing Co., Ltd., Hsinchu (TW)

(72) Inventors: Yen-Chih Chen, Hsinchu (TW); Yi-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 134 days.

(21) Appl. No.: 15/379,989

(22) Filed: Dec. 15, 2016

(65) Prior Publication Data

US 2018/0169825 A1 Jun. 21, 2018

(51) Int. Cl.
*B24B 7/22* (2006.01)
*B24B 37/005* (2012.01)
*B24B 37/20* (2012.01)
*H01L 21/306* (2006.01)

(52) U.S. Cl.
CPC ............ *B24B 37/005* (2013.01); *B24B 37/20* (2013.01); *H01L 21/30625* (2013.01)

(58) Field of Classification Search
CPC ........................................................ B24B 7/22
USPC ...................... 451/287–290, 443, 444, 5, 41
See application file for complete search history.

(56) References Cited

U.S. PATENT DOCUMENTS

| | | | |
|---|---|---|---|
| 5,974,679 A * | 11/1999 | Birang | G01B 7/345 33/553 |
| 9,502,318 B2 * | 11/2016 | Fukushima | H01L 22/26 |
| 9,835,449 B2 * | 12/2017 | Cho | G01B 21/04 |
| 2011/0256812 A1 * | 10/2011 | Dhandapani | B24B 37/042 451/56 |

* cited by examiner

*Primary Examiner* — Robert Rose
(74) *Attorney, Agent, or Firm* — McClure, Qualey & Rodack, LLP

(57) ABSTRACT

A chemical mechanical polish (CMP) system is provided. The CMP system includes a platen rotatable about a rotation axis. The CMP system further includes a polishing pad positioned on the platen. The CMP system also includes a detecting module having a base portion and a number of pins positioned over the polishing pad. The pins are movable relative to the platen and have their bottom end in direct contact with the polishing pad to detect the planarity of the polishing pad.

20 Claims, 9 Drawing Sheets

METHOD AND SYSTEM FOR MONITORING POLISHING PAD BEFORE CMP PROCESS

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer. Generally, the processes include a chemical mechanical polishing (CMP) process for planarization of semiconductor wafers, thereby helping to provide more precisely structured device features on the ICs. The CMP process is a planarization process that combines chemical removal with mechanical polishing. The CMP process is a favored process because it achieves global planarization across the entire wafer surface. The CMP polishes and removes materials from the wafer, and works on multi-material surfaces. Furthermore, the CMP process avoids the use of hazardous gasses, and/or is usually a low-cost process.

Since the CMP process is one of the most important processes for forming ICs, it is desired to have mechanisms to maintain the reliability and the efficiency of the CMP process.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
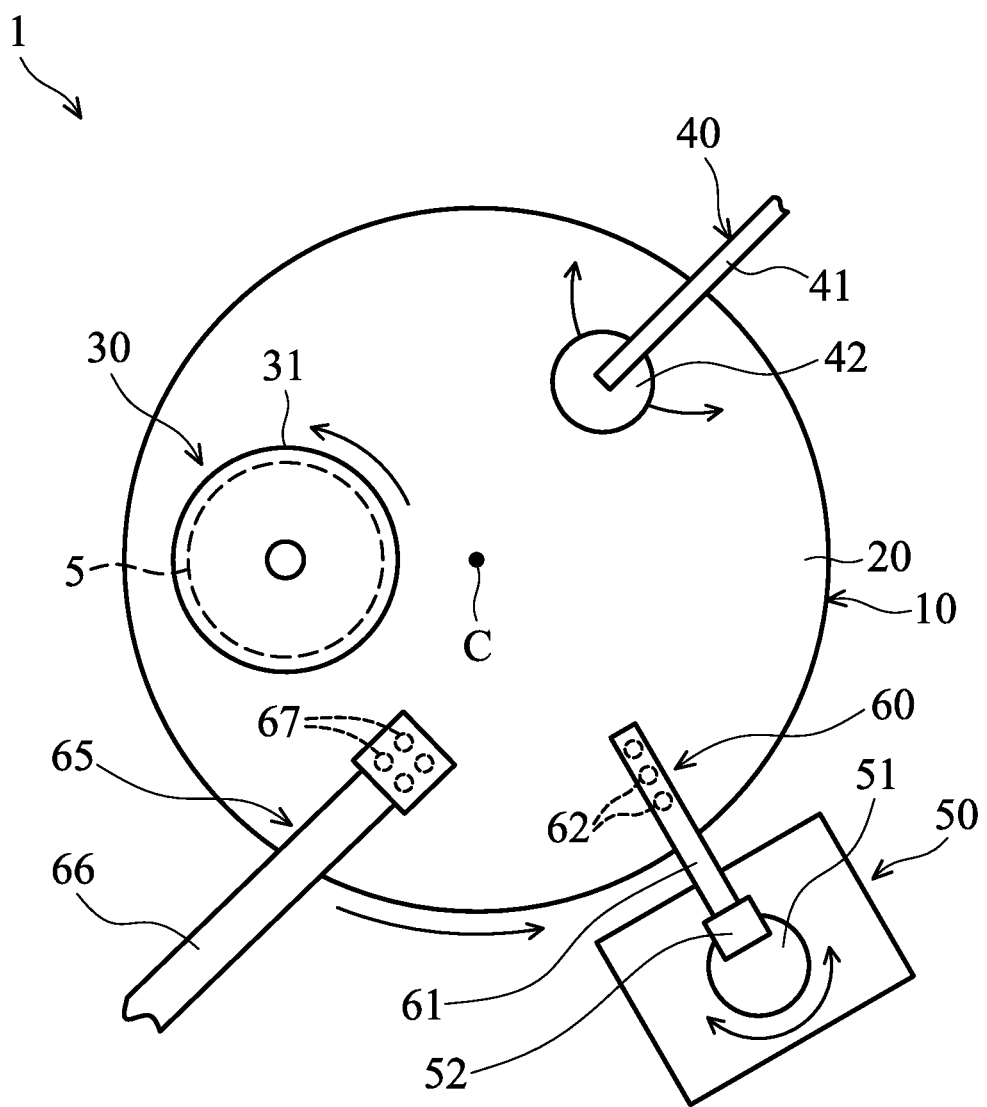
FIG. 1 is a schematic view of a Chemical Mechanical Polishing (CMP) system 1 in a CMP process, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

Figure 2:
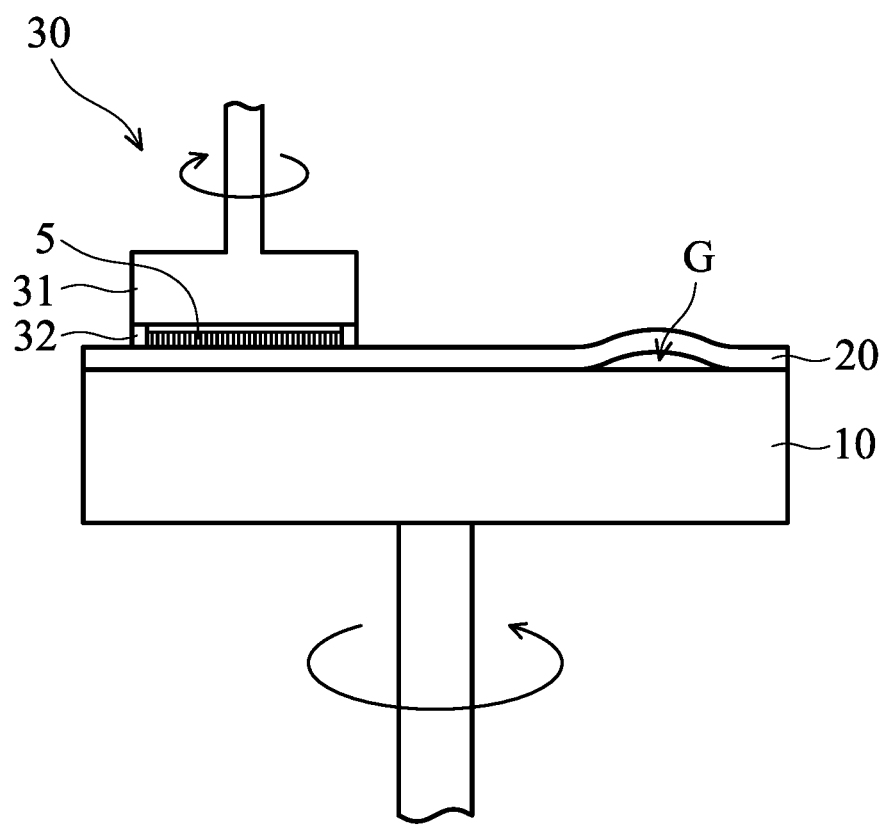
FIG. 2 is a side view of partial elements of a CMP system in a CMP process, in accordance with some embodiments.

FIG. 1 is a schematic view of a Chemical Mechanical Polishing (CMP) system 1 as a CMP process is performed. FIG. 2 is a side view of partial elements of the CMP system 1 as a CMP process is performed. The CMP system 1 is configured for performing a planarization process on a wafer 5 in a semiconductor manufacturing process.

The wafer 5 may be made of silicon or other semiconductor materials. Alternatively or additionally, the wafer 5 may include other elementary semiconductor materials such as germanium (Ge). In some embodiments, the wafer 5 is made of a compound semiconductor such as silicon carbide (SiC), gallium arsenic (GaAs), indium arsenide (InAs), or indium phosphide (InP). In some embodiments, the wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the wafer 5 includes an epitaxial layer. For example, the wafer 5 has an epitaxial layer overlying a bulk semiconductor. In some other embodiments, the wafer 5 may be a silicon-on-insulator (SOI) or a germanium-on-insulator (GOI) substrate.

The wafer 5 may have various device elements. Examples of device elements that are formed in the wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/ NFETs), etc.), diodes, and/or other applicable elements. Various processes are performed to form the device elements, such as deposition, etching, implantation, photolithography, annealing, and/or other suitable processes. In some embodiments, a shallow trench isolation (STI) layer, an inter-layer dielectric (ILD), or an inter-metal dielectric layer covers the device elements formed on the wafer 5.

The CMP system 1 includes a platen 10, a polishing pad 20, a wafer holder 30, a conditioning assembly 40, a support assembly 50, an atomizer 60, and a slurry dispenser 65, in accordance with some embodiments. The elements of the CMP system 1 can be added to or omitted, and the disclosure should not be limited by the embodiments.

The platen 10 is configured to accept and rotate the polishing pad 20 about a rotation axis C. In some embodiments, the platen 10 is circular in shape. The diameter of the platen 10 lies in a range substantially that is larger than the diameter of the wafer 5 to be polished.

The polishing pad 20 is fixed on the platen 10. The polishing pad 20 may a consumable item used in a semiconductor wafer fabrication process. The polishing pad 20 may be a hard, incompressible pad or a soft pad. For oxide polishing, hard and stiffer pads are generally used to achieve planarity. Softer pads are generally used in other polishing processes to achieve improved uniformity and smooth surface. The hard pads and the soft pads may also be combined in an arrangement of stacked pads for customized applications.

The wafer holder 30 is configured to house the wafer 5. In some embodiments, the wafer holder 30 includes a carrier head 31 and a retaining ring 32 (FIG. 2). The retainer ring 32, in annular shape with a hollow center, is positioned under the carrier head 31. The wafer 5 is placed in the hollow center of retainer ring 32 during the CMP process. The wafer holder 30 may be a vacuum chuck or the wafer 5 may be attached to it by an adhesive material or some other method for holding the wafer 5 could be used.

In some embodiments, the retaining ring 32 is composed of two pieces. The first, or upper, piece is usually of a metal material such as stainless steel, aluminum, or molybdenum, but may be other materials. The second, or lower, piece is of a plastic material such as polyphenylene sulfide (PPS), polyethylene terephthalate, polyetheretherketone, polybutylene terephthalate or Ertalyte TX from Quadrant Engineering Plastic Products. However, it should be appreciated that many variations and modifications can be made to embodiments of the disclosure.

The conditioning assembly 40 is configured for conditioning of the polishing pad 20. In some embodiments, the conditioning assembly 40 includes a conditioning arm 41 and a pad conditioner 42. The conditioning arm 41 holds pad conditioner 42 in contact with polishing pad 20. The conditioning arm 41 moves the pad conditioner 42 in a sweeping motion across a region of the polishing pad 20. The pad conditioner 42 includes a substrate over which an array of abrasive particles, such as diamonds, is bonded using, for example, electroplating. The pad conditioner 42 removes built-up wafer debris and excess slurry from polishing pad 20. The pad conditioner 42 also acts as an abrasive for polishing pad 20 to create an appropriate texture against which the wafer may be properly planarized.

The support assembly 50 is used to support the atomizer 60. In some embodiments, the support assembly 50 is positioned adjacent to the platen 10 and includes a shaft 51 and a connector 52, and the atomizer 60 includes a dispenser arm 61 and a number of atomizer nozzles 62. The dispenser arm 61 is detachably connected to the connector 52. One fastening member such as a screw may be used to affix the dispenser arm 61 to the connector 52. In some embodiments, the shaft 51 is ratable to move the connector 52 and the dispenser arm 61 in a sweeping motion across the polishing pad 20. However, it should be appreciated that many variations and modifications can be made to embodiments of the disclosure.

The atomizer nozzle 62 formed on the bottom surface of the dispenser arm 61 for supplying high pressure rinse over the polishing pad 20, thereby cleaning the polish pad 20.

The slurry dispenser 65 includes a dispenser arm 66 and a number of nozzles 67. The nozzles 67 formed on the bottom surface of the dispenser arm 66 for supplying slurry over the polishing pad 20. The composition of the slurry supplied by the slurry dispenser 65 depends on the type of material on the wafer surface undergoing CMP. For example, oxide file has a higher hardness than copper film; therefore oxide CMP slurries composition typically has a higher remove rate than copper CMP slurries.

Referring to FIG. 2, in some embodiments, a bubble G is abnormally formed between the polishing pad 20 and the platen 10 during the process of attaching the polishing pad 20 to the platen 10. The bubble G results in an uneven surface of the polishing pad 20. As a result, when the wafer holder 30 is apply downward pressure and causes the wafer 5 to come in contact with polishing pad 20, a high risk of wafer cracking may occur.

Figure 3:
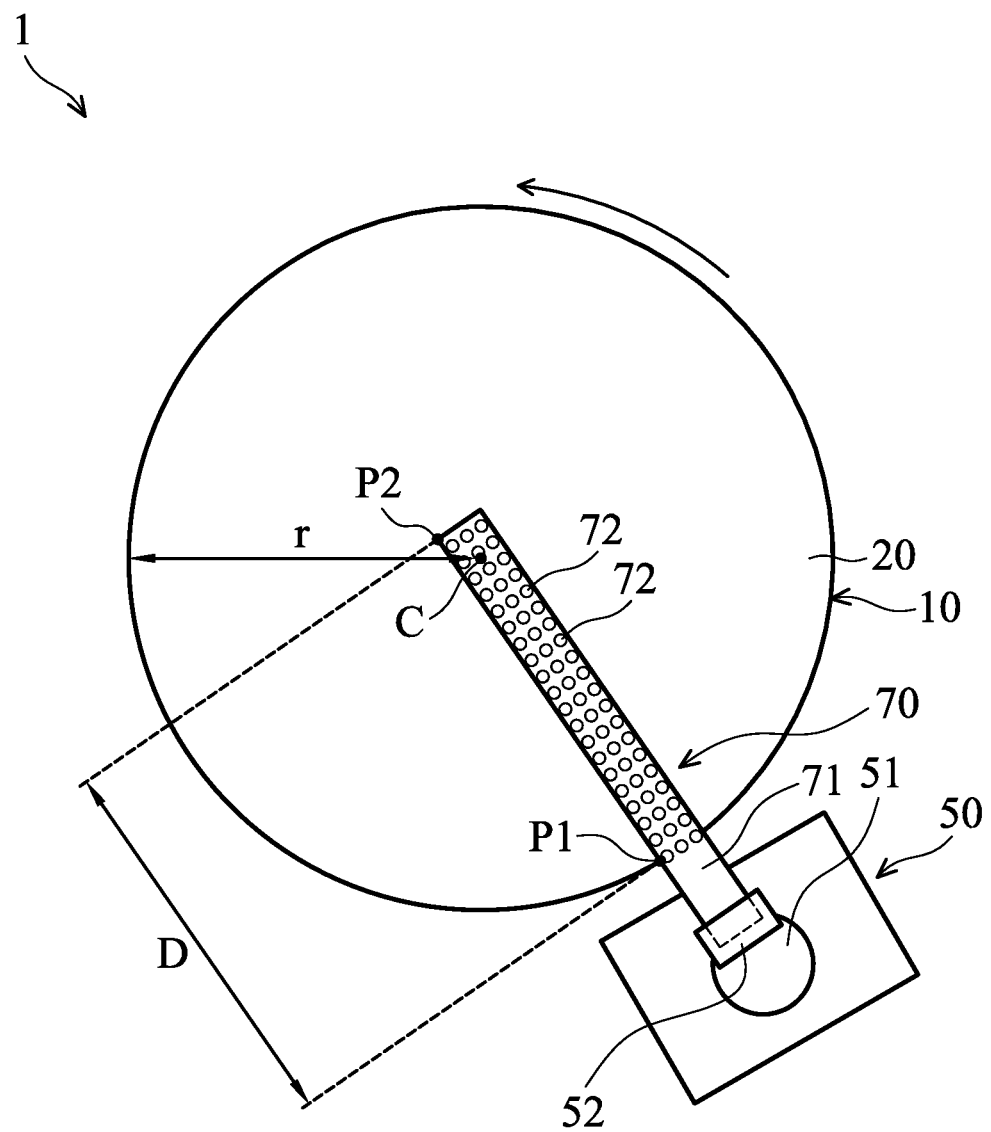
FIG. 3 is a schematic view of a CMP system in a monitoring process prior to a CMP process, in accordance with some embodiments.

In order to overcome the drawbacks mentioned above, the polishing pad 20 needs to be monitored before the CMP process to find out if the surface of the polishing pad 20 is flat or not. As shown in FIG. 3, a detecting module 70 is used to check the surface flatness of the polishing pad 20.

In some embodiments, the detecting module 70 includes a base portion 71 and a number of pins 72. The base portion 71 is detachably connected to the connector 52 of the support assembly 50. One fastening member (not shown in figures) such as a screw may be used to affix the base portion 71 to the connector 52.

In some embodiments, the base portion 71 extends across the rotation axis C about which the platen 10 and the polishing pad 20 are rotated. The base portion 71 may be positioned perpendicular to the circumference of the platen 10 and the circumference of the polishing pad 20. The base portion 71 extends a predetermined distance D from a first point P1 which is located over the circumference of the polishing pad 10 to a second point P2. The predetermined distance D is greater than or equal to the radius r of the polishing pad 20.

The pins 72 positioned on the base portion 71. The pins 72 are movable relative to the platen 10 along a direction that is substantially parallel to the rotation axis C. In some embodiments, the pins 72 are arranged in multiple rows that are parallel to the longitudinal axis of the base portion 71. The pins 72 are arranged in a dense-pitch for improving detecting accuracy. For example, the width of each pin 72 is in a range from about 3 mm to 5 mm, and the pitches of the two neighboring pin 72 is smaller than the width of each pin 72. The pins 72 are made of polyphenylene sulfide (PPS) to avoid the occurrence of surface scratch on the polishing pad 20 during the monitoring process.

Figure 4:
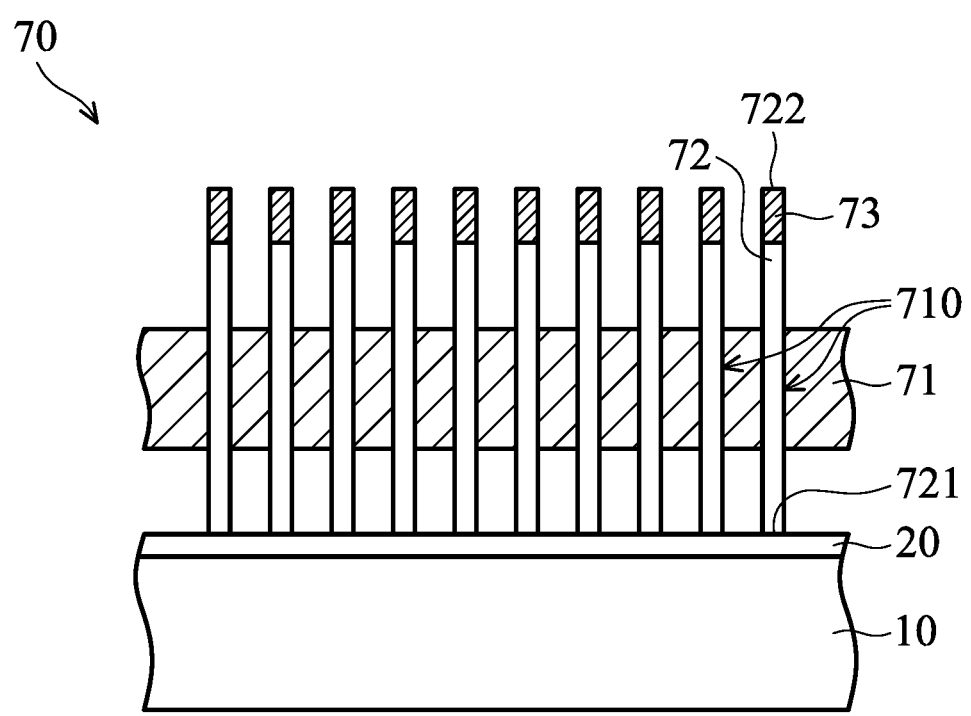
FIG. 4 shows a cross sectional view of a detecting module placed over a polishing pad and a platen, in accordance with some embodiments.

FIG. 4 shows a cross sectional view of the detecting module 70 placed over the polishing pad 20 and platen 10. In some embodiments, the base portion 71 has a number of through holes 710 for receiving the pins 72. The pins 72 passes through the through holes 710 with their top ends 722 and bottom end 721 exposed by the through holes 710. In some embodiments, the pins 72 are positioned in the through holes 710 in a tight fit manner. As a result, the pins 72 are held by the base portion 71 by friction force and vertical position of the pins 72 are maintained if no external thrust force is applied.

In some embodiments, a symbol 72 for facilitating the examining the position of the pins 72 is formed on each pin 72. The symbol 72 may be a dye applying on the outer surface of the pin 72. The color of the dye may different from the color of the pin 72. The symbols 72 is formed adjacent to the top end 722 which is opposite to the bottom end 721 by which the pin 72 contacting the polishing pad 20 in the polishing pad monitoring process. The symbol 72 may be immediately adjacent to the top end 722. Alternatively, the symbol 72 may be distant from the top end 722.

Figure 5:
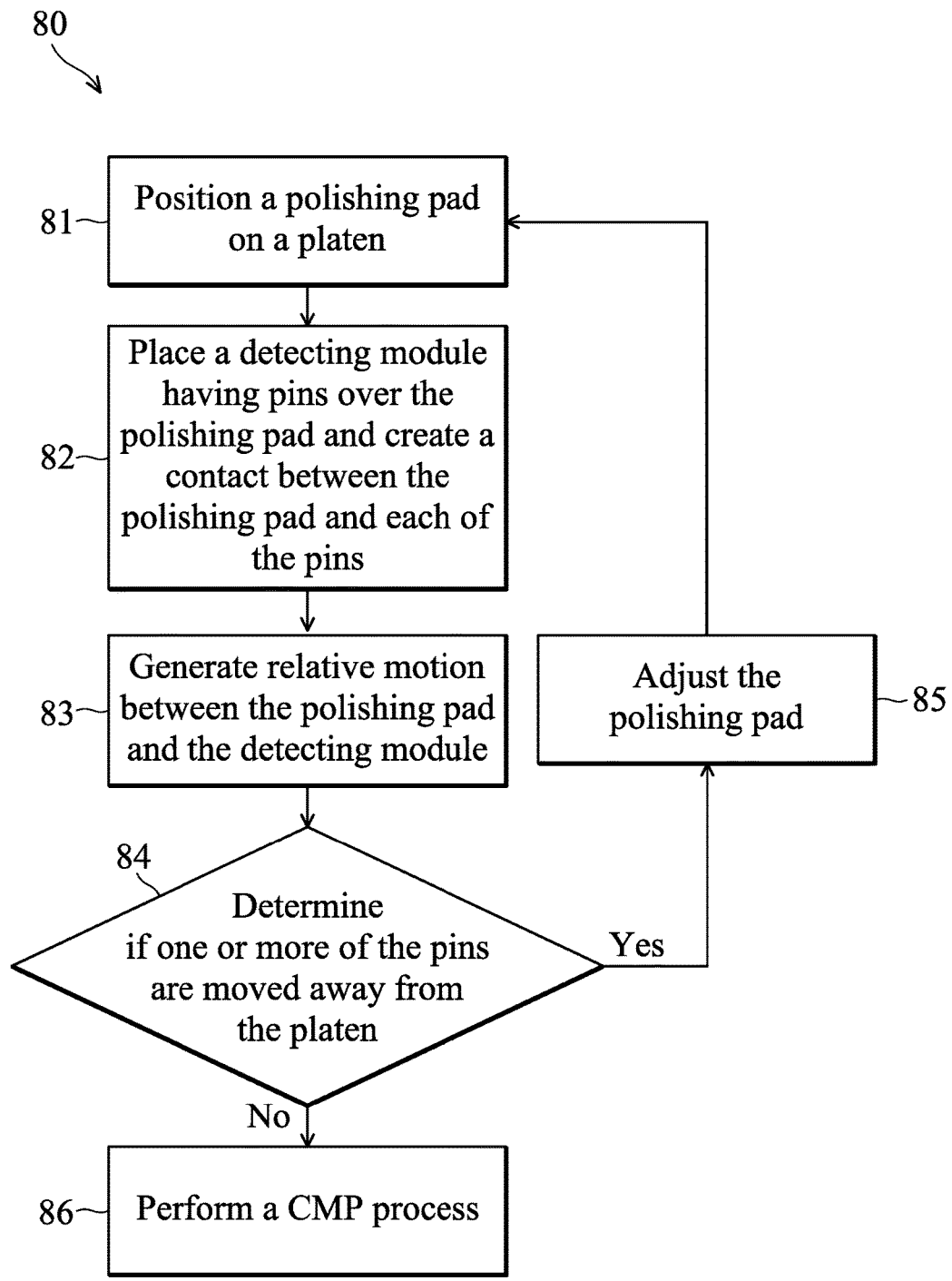
FIG. 5 is a flow chart illustrating a method for processing a wafer, in accordance with some embodiments.

FIG. 5 is a flow chart illustrating a method 80 for processing a wafer 5, in accordance with some embodiments. For illustration, the flow chart will be described with the schematic views shown in FIGS. 1-4. Some of the stages described can be replaced or eliminated for different embodiments. Additional features can be added in the semiconductor device structure. Some of the features described below can be replaced or eliminated for different embodiments.

The method 80 begins with an operation 81 in which the polishing pad 20 is positioned on the platen 10. Under normal wafer fabrication conditions, the polishing pad 20 is replaced after about 20 hours of usage. To replace the polishing pad 20, the polishing pad 20 is manually attached to and lies on the platen 10 by an adhesive. Typically, a larger polishing pad 20 is used for a larger semiconductor wafer, and the consistent and uniform planarization of the polishing pad 20 for larger semiconductor wafer would be more difficult to achieve than for smaller wafer sizes. As a result, a bubble G may be formed between the polishing pad 20 and the platen 10 as shown in FIG. 2, in some abnormal cases.

The method 80 continues with operation 82 in which the detecting module 70 is positioned over the polishing pad 20 to make the bottom ends 721 of the pins 72 be in touch with the polishing pad 20. The detecting module 70 may first be affixed to the support assembly 50 and be lowered down to the polishing pad 20 by the support assembly 50.

In some embodiments, before the detecting module 70 is put on the polishing pad 20, the pins 72 on the base portion 71 are not arranged in order, i.e., the bottom ends 721 are not arranged on the same plane. This disorder may cause a portion of the pins 72 to not come into contact with the polishing pad 20 while the other pins 72 are connected to the polishing pad 20 and lead to a poor detection accuracy in the subsequent monitoring process. Therefore, a flat plate (not shown in figure) may be used to press the bottom ends 721 and/or the top ends 722 of the pins 72 to make sure the pins 72 are arranged in an orderly manner. Alternatively, pressure may be applied to the base portion 71 when the detecting module 70 is positioned over the polishing pad 20 to make all of the pins 72 abut against the polishing pad 20.

The method 80 continues with operation 83 in which relative motion between the polishing pad 20 and the detecting module 70 is generated. In some embodiments, the relative motion is performed by rotating the polishing pad 20. In some other embodiments, the relative motion is performed by rotating the polishing pad 20 and moving the detecting module 70 simultaneously. While the relative motion is performed, the pins 72 sweep across the entire surface of the polishing pad 20. In cases where the base portion 71 is not arranged across the rotation axis C, the pins 72 sweep across the edge portion of the polish pad 20 at which the wafer 5 to be polished is going to contact.

Figure 6:
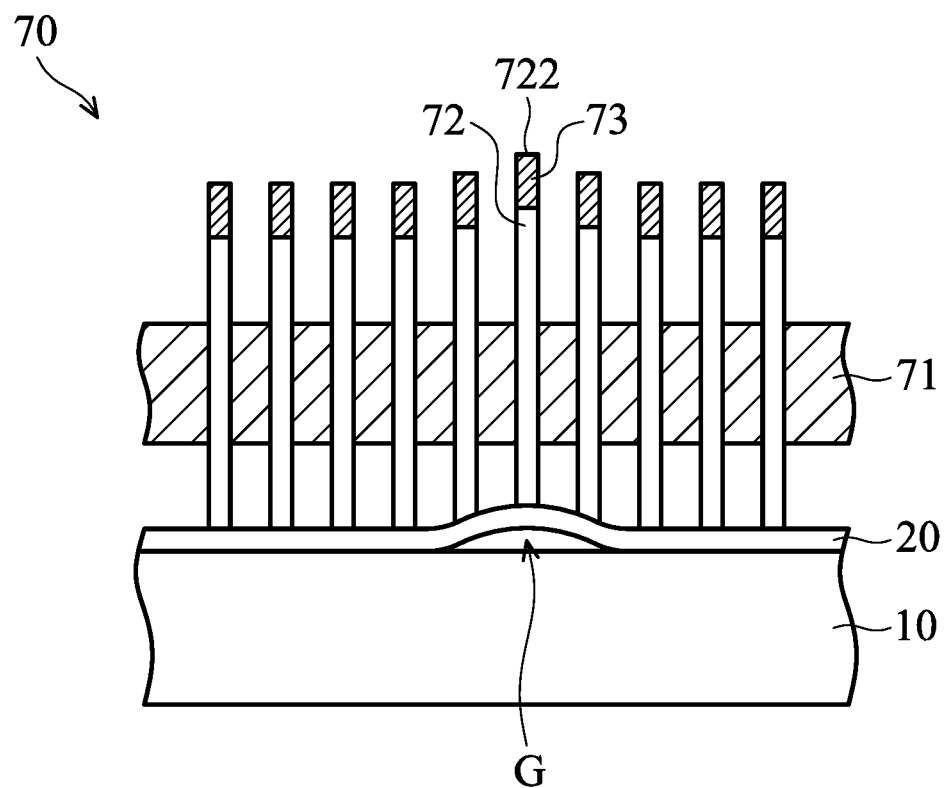
FIG. 6 shows a cross sectional view of a detecting module placed over a polishing pad and a platen having a bubble formed therebetween, in accordance with some embodiments.

The method 80 continues with operation 84 in which the positioned of the pins 72 are analyzed to determine if one or more of the pins 72 are moved away from the platen 10 while the operation 83 is performed. As shown in FIG. 6, in cases where there is a bubble G formed between the polishing pad 20 and the platen 10, the pins 72 passing through the region over the bubble G are pushed by the polishing pad 20 and vertically moved away from the platen 10 to an elevated position.

In some embodiments, the pins 72 stay in the elevated position by a friction force generated between the pins 72 and the inner wall of the through hole 710 to keep their top ends 722 higher than the other pins 72. As a result, the symbols 73 formed on the pins 72 can be examined. Afterwards, an operation personnel or a control unit which receives images from a CCD decide if an operation 85 should be performed or not according to the examined resulted.

In operation 85, an adjustment process for the polishing pad 20 is performed. In some embodiments, in the adjustment process, the entire polishing pad 20 is removed from the platen 10. Afterwards, the operation 81 is conducted again. The polishing pad 20 removed from the platen 10 or another new polishing pad 20 is attached to the platen 10 again. In some embodiments, one or more regions of the polishing pad 20 are going to be adjusted based on the position where the pins 72 that are moved are located. For example, if the bubble G is located near the circumference of the polishing pad 20, the pins 72 that are located adjacent to the point P1 (FIG. 3) are moved, and the pins 72 that are located adjacent to the point P2 are not moved. According to the detecting result, the location of the bubble G can be determined, and the edge portion of the polishing pad 20 is separated from the platen 10 and is attached to the platen 10 again.

If no pins 72 are lift during operation 83, the method 80 continues with operation 86 to perform a CMP process. In cases where the detecting module 70 is positioned at the support assembly 50, the detecting module 70 is replaced by the atomizer 60 before the beginning of the CMP process. Afterwards, the wafer holder 30 and the conditioning assembly 40 are moved over the polishing pad 20.

In the CMP process, the atomizer 60 supplies high pressure rinse over the polishing pad 20, and the slurry dispenser 65 supplies slurry over the polishing pad 20, and the platen 10 is rotated so that different areas of the polishing pad 20 are fed under the wafer holder 30. In addition, the conditioning arm 41 sweeps the pad conditioner 42 across the areas previously used to polish the wafer 5 and conditions these areas. The platen 10 then moves these areas back under carrier 110 and the wafer 5. Therefore, the polishing pad 20 may be simultaneously conditioned while the wafer 5 is polished.

Figure 7:
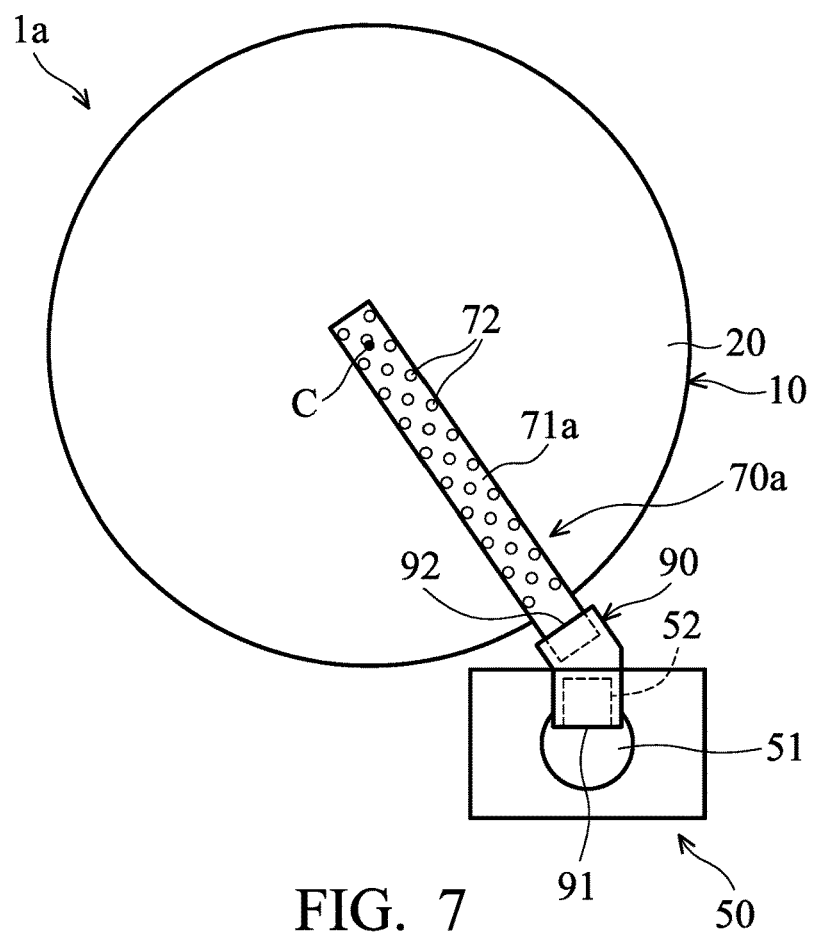
FIG. 7 is a schematic view of a Chemical Mechanical Polishing (CMP) system before a CMP process, in accordance with some embodiments.

FIG. 7 is a schematic view of a Chemical Mechanical Polishing (CMP) system 1a before a CMP process. In the embodiments shown in FIG. 7, elements similar to those shown in FIGS. 1-4 are provided with the same reference numbers, and the features thereof are not reiterated in the interests of brevity. Differences between the CMP system 1a and the CMP system 1 shown in FIG. 3 include the detecting module 70 being replaced with the detecting module 70a and the support assembly 50 being oriented obliquely relative to the circumference of the polished pad 20.

The adaptor 90 has two end portions 91 and 92 oriented less than 180 degrees relative to one another, and the two end portions 91 and 92 are connected to the detecting module 70a and the connector 52 of the support assembly 50. Therefore, even though the front surface of the connector 52 for connecting the detecting module 70 does not face the platen 10, the detecting module 70a can be positioned over the polishing pad 20 and pass through the rotation axis C of the polishing pad 20.

Figure 8:
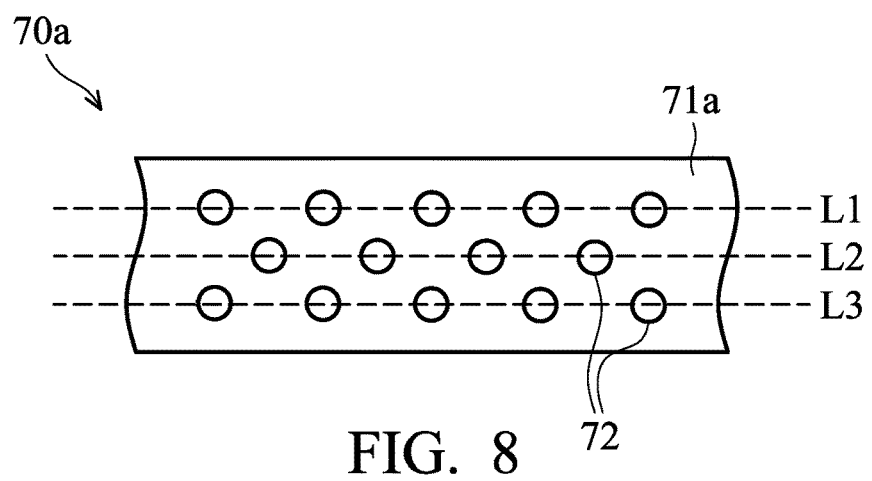
FIG. 8 is a top view of a detecting module, in accordance with some embodiments.

Referring to FIG. 8, the detecting module 70a includes a base portion 71a and a number of pins 72. In some embodiments, the pins 72 are arranged in multiple rows L1, L2 and L3 that are parallel to the longitudinal axis of the base portion 71a. In some embodiments, the pins 72 are arranged in a dense-pitch, and the pins 72 in each two neighboring rows are arranged in a staggered manner to improve the accuracy of the detecting result. For example, the pins 72 in rows L1 and L2 are arranged in a staggered manner, and the pins 72 in rows L2 and L3 are arranged in a staggered manner.

Figure 9:
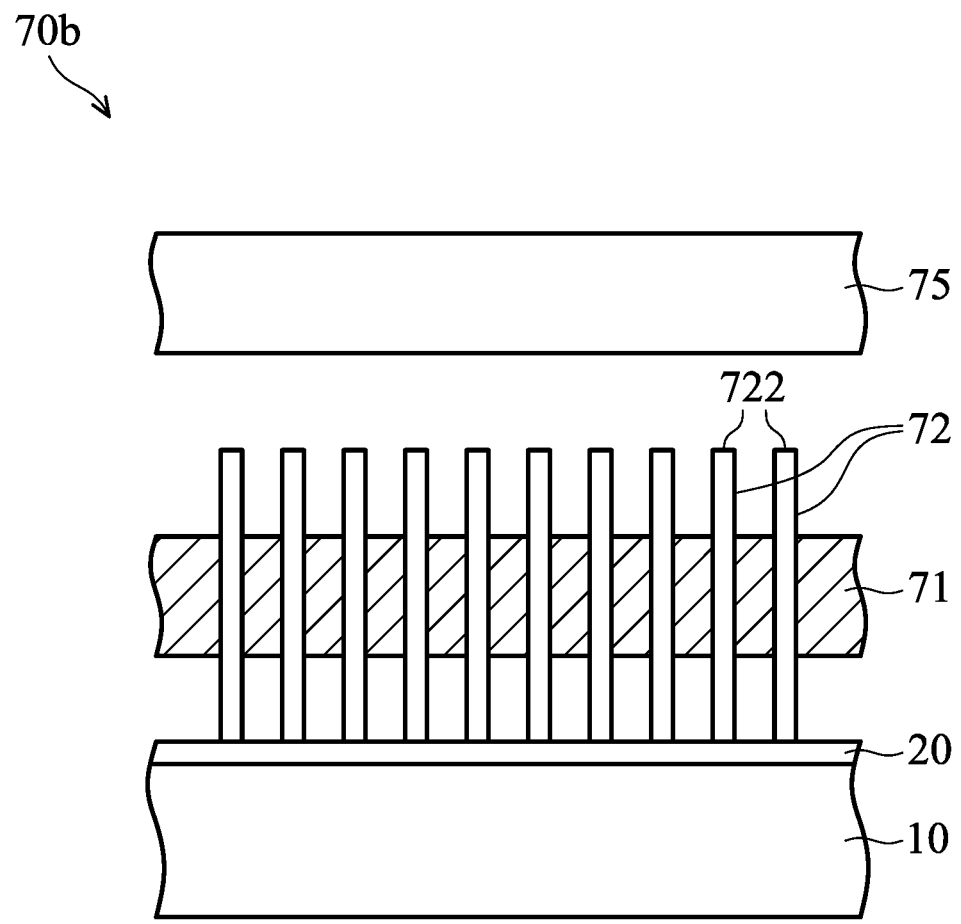
FIG. 9 is a cross sectional view of a detecting module placed over a polishing pad and a platen, in accordance with some embodiments.

FIG. 9 is a cross sectional view of a detecting module 70b positioned on the polishing pad 20 and the platen 10. In the embodiments shown in FIG. 8, elements similar to those shown in FIG. 4 are provided with the same reference numbers, and the features thereof are not reiterated in the interests of brevity. Differences between the detecting module 70b and the detecting module 70 include the detecting module 70b further including a sensing layer 75 positioned over the base portion 71.

Figure 10:
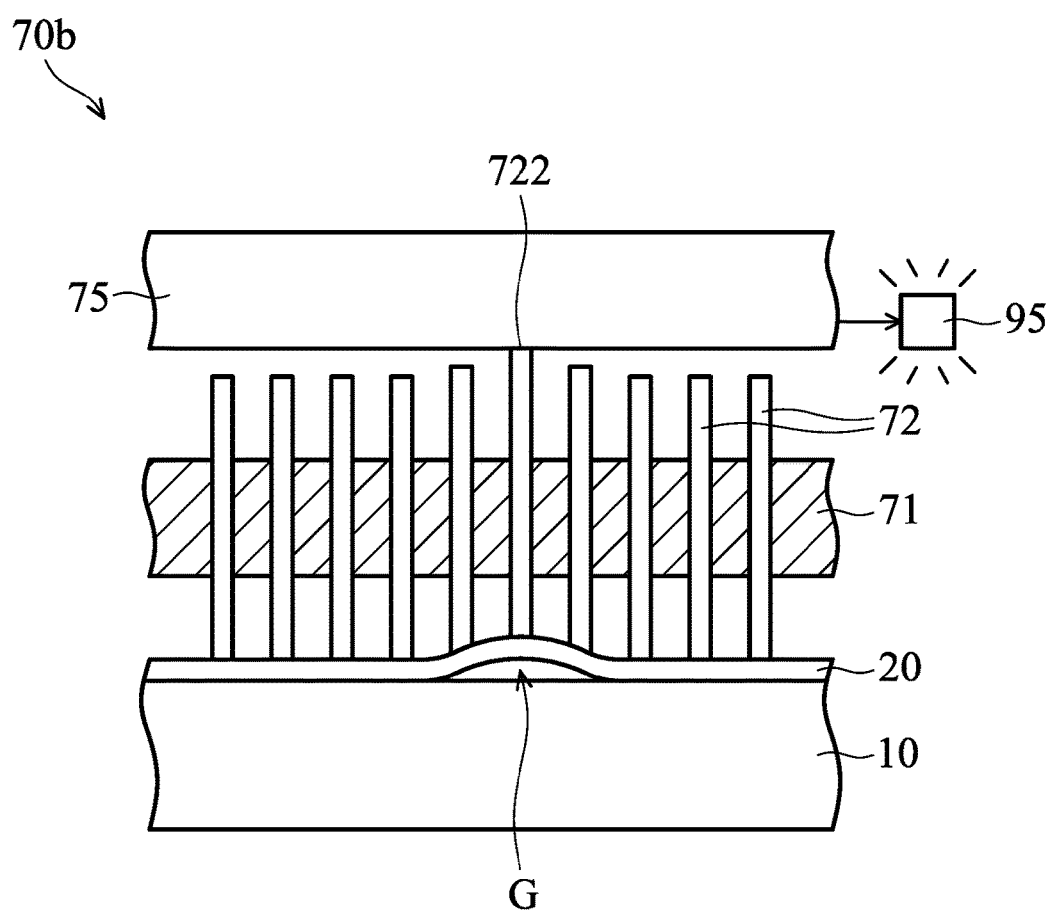
FIG. 10 is a cross sectional view of a detecting module placed over a polishing pad and a platen having a bubble formed therebetween, in accordance with some embodiments.

In some embodiments, the sensing layer 75 is composed of a piezoelectric material and is spaced apart from the top ends 722 of the pins 72 by a predetermined distance. As shown in FIG. 10, if a bubble G is formed between the polishing pad 20 and the platen 10, the pins 72 passing through the region over the bubble G are abutted by the polishing pad 20 and moved away from the platen 10. When the sensing layer 75 is pressed by the pins 72, an alarm is triggered by a user interface 95 such as a display to inform the operating personnel to perform a polishing-pad adjustment process. In some embodiments, once a signal is issued from the sensing layer 75, the rotation of the platen 10 is stopped, and the position of the bubble G can be located.

Embodiments of mechanisms for monitoring the polishing pad before a CMP process described above use a detecting module to check the condition of the polishing pad. In cases where a bubble is formed under the polishing pad, the pins of the detecting module are moved to an elevated position to warn of the polishing pad being uneven. As a result, the polishing pad is adjusted before the CMP process, and wafer cracking due to an uneven polishing pad is avoided. Compared with a conventional method in which the surface of the polishing pad is checked by inspection or hand touching, the use of the detecting module has higher efficiency and improved detection accuracy.

In accordance with some embodiments a chemical mechanical polish (CMP) system is provided. The CMP system includes a platen rotatable about a rotation axis. The CMP system further includes a polishing pad positioned on the platen. The CMP system also includes a detecting module having a base portion and a number of pins positioned over the polishing pad. The pins are movable relative to the platen and have their bottom end in direct contact with the polishing pad to detect the planarity of the polishing pad.

In accordance with some embodiments a chemical mechanical polish (CMP) system is provided. The CMP system includes a platen and a polishing pad positioned on the platen. The CMP system further includes an atomizer configured to supply rinse over the polishing pad. The CMP system also includes a detecting module configured to detect the planarity of the polishing pad. The detecting module includes a number of pins arranged adjacent to each other and movable relative to the platen independently. In addition, The CMP system includes a support assembly positioned adjacent to the platen. The support assembly is configured to connect the detecting module to enable the pins to be in contact with the polishing pad before a CMP process, and the support assembly is configured to connect to the atomizer during the CMP process.

In accordance with some embodiments method for monitoring a polishing pad used in a CMP process is provided. The method includes positioning the polishing pad on a platen. The method further includes placing a detecting module over the polishing pad. The detecting module has a number of pins being in contact with the polishing pad. The method also includes generating relative motion between the polishing pad and the detecting module to make the pins sweep across the polishing pad. In addition, the method includes determining if one or more of the pins are moved away from the platen while the relative motion between the polishing pad and the detecting module is performed. If so, the polishing pad is adjusted.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A chemical mechanical polish (CMP) system, comprising:
   a plate
   n rotatable about a rotation axis;
   a polishing pad positioned on the platen; and
   a detecting module comprising:
      a base portion positioned over the polishing pad; and
      a plurality of pins positioned on the base portion and each having a bottom end in direct contact with the polishing pad, wherein the pins are movable relative to the platen along a direction that is substantially parallel to the rotation axis, wherein the pins are arranged in multiple rows that are parallel to a longitudinal axis of the detector arm.

2. The CMP system as claimed in claim 1, wherein the pins in each two neighboring rows are arranged in a staggered manner.

3. The CMP system as claimed in claim 1, wherein the base portion extends a predetermined distance from a first point which is located over the circumference of the polishing pad to a second point, wherein the predetermined distance is greater than or equal to the radius of the polishing pad, and the pins are arranged along a longitudinal direction of the base portion from the first point to the second point.

4. The CMP system as claimed in claim 1, wherein in the top view, the base portion is perpendicular to the circumference of the polishing pad.

5. The CMP system as claimed in claim 1, wherein the pins are made of polyphenylene sulfide (PPS).

6. The CMP system as claimed in claim 1, wherein the detecting module further comprises a sensing layer positioned over the base portion, and the pin moved away from the platen contacts the sensing layer to enable the sensing layer to issue an alarm.

7. The CMP system as claimed in claim 1, wherein a symbol with a color that is different from the color of the pin is positioned on each of the pins and is arranged adjacent to a top end of each of the pins.

8. A chemical mechanical polish (CMP) system, comprising:
a platen;
a polishing pad positioned on the platen;
an atomizer configured to supply rinse over the polishing pad;
a detecting module configured to detect the planarity of the polishing pad and comprising a plurality of pins arranged adjacent to each other and movable relative to the platen independently; and
a support assembly positioned adjacent to the platen, wherein the support assembly is configured to connect the detecting module to enable the pins to be in contact with the polishing pad before a CMP process, and the support assembly is configured to connect to the atomizer during the CMP process.

9. The CMP system as claimed in claim 8, further comprising:
a wafer holder configured to house a semiconductor wafer; and
a conditioning pad configured to condition a surface of the polishing pad;
wherein the atomizer, the wafer holder, and the conditioning pad are positioned over the polishing pad during the CMP process.

10. The CMP system as claimed in claim 9, wherein the wafer holder comprises a retainer ring in direct contact with the polishing pad during the CMP process, and the retainer ring and the pins are made of polyphenylene sulfide (PPS).

11. The CMP system as claimed in claim 8, further comprising an adaptor comprising two end portions oriented less than 180 degrees relative to one another, and the two end portions are connected to the detecting module and the support assembly.

12. A method for monitoring a polishing pad used in a CMP process, comprising:
positioning the polishing pad on a platen;
placing a detecting module having a plurality of pins over the polishing pad and creating a contact between the polishing pad and each of the pins;
generating relative motion between the polishing pad and the detecting module to make the pins sweep across the polishing pad; and
determining if one or more of the pins are moved away from the platen while the relative motion between the polishing pad and the detecting module is performed, and if so adjusting the polishing pad.

13. The method as claimed in claim 12, further comprising performing a CMP process if no pins are moved away from the platen while the relative motion between the polishing pad and the detecting module is performed.

14. The method as claimed in claim 12, wherein adjusting the polishing pad comprises removing the polishing pad from the platen and positioning the polishing pad or another polishing pad on the platen again.

15. The method as claimed in claim 12, wherein adjusting the polishing pad comprises determining which region of the polishing pad is going to be adjusted based on the position where the pin that is moved is located.

16. The method as claimed in claim 12, wherein generating relative motion between the polishing pad and the detecting module comprises rotating the platen about a rotation axis and standing the detecting module over the platen.

17. The method as claimed in claim 12, wherein the detecting module extends across a rotation axis of the platen, and the area of the polishing pad under the detecting module is in direct contact with the pins.

18. The method as claimed in claim 12, wherein if one or more of the pins are moved away from the platen, a sensing layer positioned above the pins is abutted by the one or more of the pins and issues an alarm.

19. The method as claimed in claim 12, wherein if one or more of the pins are moved away from the platen, symbols positioned on the top ends of the one or more of the pins are observed.

20. The CMP system as claimed in claim 8, wherein the detecting module further comprises a base portion positioned over the polishing pad, and the pins are arranged in multiple rows that are parallel to a longitudinal axis of the detector arm.

* * * * *